US009491884B2

United States Patent
Chung et al.

(10) Patent No.: US 9,491,884 B2
(45) Date of Patent: Nov. 8, 2016

(54) SERVER CABINET DRAWER STRUCTURE

(71) Applicant: AIC INC., Taoyuan Hsien (TW)

(72) Inventors: Ta-Chih Chung, Taoyuan Hsien (TW); Fu-An Jhang, Taoyuan Hsien (TW)

(73) Assignee: AIC INC., Taoyuan Hsien (TW)

( * ) Notice: Subject to any disclaimer, the term of this patent is extended or adjusted under 35 U.S.C. 154(b) by 84 days.

(21) Appl. No.: 14/597,717

(22) Filed: Jan. 15, 2015

(65) Prior Publication Data

US 2016/0212877 A1 Jul. 21, 2016

(51) Int. Cl.
*H05K 7/00* (2006.01)
*H05K 7/14* (2006.01)

(52) U.S. Cl.
CPC ................... *H05K 7/1487* (2013.01)

(58) Field of Classification Search
None
See application file for complete search history.

(56) References Cited

U.S. PATENT DOCUMENTS

| | | | | |
|---|---|---|---|---|
| 5,332,306 A * | 7/1994 | Babb | H05K 7/1418 | 312/223.1 |
| 5,774,343 A * | 6/1998 | Benson | H05K 7/16 | 211/150 |
| 5,995,364 A * | 11/1999 | McAnally | G06F 1/187 | 361/679.31 |
| 6,078,504 A * | 6/2000 | Miles | G06F 1/184 | 174/17 CT |
| 6,111,195 A * | 8/2000 | Hand | A47B 47/02 | 174/495 |
| 6,398,325 B1 * | 6/2002 | Chen | G06F 1/181 | 292/128 |
| 6,507,487 B1 * | 1/2003 | Barina | G06F 1/187 | 312/236 |
| 6,529,373 B1 * | 3/2003 | Liao | G06F 1/187 | 211/26 |
| 6,530,551 B2 * | 3/2003 | Gan | G06F 1/184 | 248/694 |
| 6,535,391 B2 * | 3/2003 | Larsen | G06F 1/187 | 312/223.1 |
| 6,826,044 B2 * | 11/2004 | Gan | G06F 1/187 | 361/679.58 |
| 6,826,055 B2 * | 11/2004 | Mease | G06F 1/184 | 312/223.1 |
| 6,882,527 B2 * | 4/2005 | Wang | G06F 1/187 | 312/223.2 |
| 7,042,721 B2 * | 5/2006 | Olesiewicz | G06F 1/187 | 312/223.2 |
| 7,102,886 B2 * | 9/2006 | Peng | G06F 1/181 | 211/26 |
| 7,264,321 B1 * | 9/2007 | Bueley | A47B 47/02 | 312/257.1 |
| 7,423,870 B2 * | 9/2008 | Carlisi | H05K 7/1489 | 280/47.26 |
| 7,529,097 B2 * | 5/2009 | Coglitore | H05K 7/1488 | 211/153 |
| 7,639,486 B2 * | 12/2009 | Champion | G06F 1/183 | 211/26 |
| 7,643,280 B2 * | 1/2010 | Chen | G11B 33/123 | 361/679.33 |
| 7,724,543 B2 * | 5/2010 | Ozawa | H04Q 1/02 | 361/729 |
| 7,848,091 B2 * | 12/2010 | Han | G06F 1/1616 | 361/679.26 |

(Continued)

*Primary Examiner* — Courtney Smith
*Assistant Examiner* — Rashen E Morrison
(74) *Attorney, Agent, or Firm* — Chun-Ming Shih; HDLS IPR Services

(57) ABSTRACT

A server cabinet drawer structure includes a carrying tray, a movably swappable frame and a lifting element. The movably swappable frame is carried by the carrying tray, and a side of the movably swappable frame is pivotally connected to the carrying tray by a pivot. The lifting element is provided for lifting the movably swappable frame away from the carrying tray and connected to the carrying tray and the movably swappable frame, so as to facilitate users to swap a data storage unit in the movably swappable frame.

17 Claims, 13 Drawing Sheets

(56) References Cited

U.S. PATENT DOCUMENTS

| | | | | |
|---|---|---|---|---|
| 7,864,514 B2* | 1/2011 | Lee | F16M 11/046 | 248/602 |
| 7,952,866 B2* | 5/2011 | Lee | G06F 1/1616 | 345/1.1 |
| 8,379,377 B2* | 2/2013 | Walters | G06F 1/1641 | 248/917 |
| 8,662,317 B2* | 3/2014 | Liang | H05K 7/1489 | 211/189 |
| 8,681,486 B2* | 3/2014 | Singhal | G06F 1/1649 | 248/917 |
| 8,817,461 B2* | 8/2014 | Chen | G06F 1/187 | 248/229.22 |
| 9,030,379 B2* | 5/2015 | Xu | G06F 1/1647 | 345/1.3 |
| 9,282,658 B1* | 3/2016 | Tsai | G11B 33/124 | |
| 2003/0202321 A1* | 10/2003 | Lin | G06F 1/187 | 361/679.33 |
| 2003/0210530 A1* | 11/2003 | Powell | H04R 1/026 | 361/727 |
| 2005/0122675 A1* | 6/2005 | Cheng | G06F 1/18 | 361/679.39 |
| 2005/0265004 A1* | 12/2005 | Coglitore | H05K 7/1488 | 361/724 |
| 2005/0286235 A1* | 12/2005 | Randall | H05K 7/1492 | 361/724 |
| 2009/0045713 A1* | 2/2009 | Kunkle | A47B 88/04 | 312/402 |
| 2011/0095662 A1* | 4/2011 | Wang | G06F 1/181 | 312/223.1 |
| 2011/0180497 A1* | 7/2011 | Zhang | H05K 7/1489 | 211/26 |
| 2011/0279956 A1* | 11/2011 | Sun | H05K 7/1489 | 361/679.02 |
| 2012/0211447 A1* | 8/2012 | Anderson | H04Q 1/09 | 211/26 |
| 2013/0162125 A1* | 6/2013 | Liang | H05K 7/1489 | 312/223.2 |
| 2013/0163167 A1* | 6/2013 | Liao | G06F 1/181 | 361/679.02 |
| 2013/0308264 A1* | 11/2013 | Zhou | G11B 33/02 | 361/679.33 |
| 2013/0316555 A1* | 11/2013 | Han | H01R 13/56 | 439/135 |
| 2014/0055959 A1* | 2/2014 | Manda | G11B 33/128 | 361/728 |
| 2014/0159554 A1* | 6/2014 | Liu | H05K 7/1488 | 312/223.2 |
| 2015/0028729 A1* | 1/2015 | Frattaruolo | H05K 5/02 | 312/223.1 |
| 2015/0313036 A1* | 10/2015 | Li | H05K 7/1489 | 312/223.2 |
| 2016/0047160 A1* | 2/2016 | Huynh | E05F 15/77 | 49/31 |
| 2016/0113398 A1* | 4/2016 | Chang | E05B 65/46 | 312/333 |

* cited by examiner

SERVER CABINET DRAWER STRUCTURE

FIELD OF THE INVENTION

The present invention relates to a server cabinet drawer, and more particularly to a server cabinet drawer structure capable of lifting a movably swappable frame.

BACKGROUND OF THE INVENTION

At present, most conventional server cabinets adopt a stacked drawer structure to store server equipments and facilitate users to maintain and repair the server equipments. Since the demand for using network becomes increasingly higher, the required load of the servers also increases, and thus more data storage units are needed.

When the data storage units are arranged densely in the drawer structure, the operating space for swapping the data storage units in the drawer structure is relatively smaller, thus making the maintenance inconvenient. Therefore, it is an important subject for related designers to install more data storage units in the limited space inside the drawer structure, while taking the convenience of maintenance into consideration.

In view of the aforementioned drawbacks of the prior art, the inventor of the present invention based on years of experience in the related industry to conduct extensive researches and experiments, and finally designed a feasible solution to overcome the drawbacks of the prior art.

SUMMARY OF THE INVENTION

Therefore, it is a primary objective of the present invention to provide a server cabinet drawer structure provided for users to swap a data storage unit inside the server cabinet drawer structure conveniently.

To achieve the aforementioned objectives, the present invention provides a server cabinet drawer structure comprising a carrying tray, a movably swappable frame and a lifting element. The movably swappable frame is carried by the carrying tray and has a side pivotally coupled to the carrying tray by a pivot. The lifting element is provided for lifting the movably swappable frame away from the carrying tray and coupled to the carrying tray and the movably swappable frame.

Preferably, the carrying tray includes a positioning assembly, and the lifting element includes a spring coupled between the carrying tray and the movably swappable frame, such that when the movably swappable frame is retracted to the carrying tray, the positioning assembly is provided for balancing a force of the spring applied to the movably swappable frame to fix the movably swappable frame. The positioning assembly includes a cover plate pivotally coupled to the carrying tray and covering the movably swappable frame, and an elastic hook arm installed to the carrying tray, such that when the movably swappable frame is retracted to the carrying tray, the cover plate covers the movably swapping frame, and the elastic hook arm hooks the cover plate to fix the cover plate and press the movably swappable frame against the carrying tray. The carrying tray includes at least one sidewall, and the elastic hook arm is installed to the sidewall. When the cover plate covers the movably swappable frame, a side edge of the cover plate covers a portion of an outer side of the sidewall, and the elastic hook arm is installed to an inner side of the sidewall, and the sidewall has a through hole corresponsive to the elastic hook arm for passing the elastic hook arm in order to hook a side edge of the cover plate. The elastic hook arm includes a protruding button, and the sidewall has a through hole corresponsive to the protruding button, and the protruding button is passed through the through hole and exposed from an outer side of the sidewall.

Preferably, when the movably swappable frame is lifted away from the carrying tray, the positioning assembly is provided for fixing the movably swappable frame. The positioning assembly includes an elastic hook arm fixed to the movably swappable frame, such that when the movably swappable frame is lifted away from the carrying tray, the elastic hook arm hooks the carrying tray to fix the movably swappable frame. The carrying tray includes at least one sidewall, and the sidewall has a positioning hole corresponsive to the elastic hook arm. The elastic hook arm has a hook portion formed thereon and configured to be corresponsive to the positioning hole. The elastic hook arm has a protruding button protruded from the elastic hook arm.

Preferably, the carrying tray includes a fixed swap frame fixed thereon and disposed adjacent to a side of the carrying tray, and the fixed swap frame is disposed between the side and the movably swappable frame. The movably swappable frame has a swap opening corresponsive to the pivot, and the swap opening and the fixed swap frame are configured adjacent to each other.

Preferably, a limit assembly is coupled between the carrying tray and the movably swappable frame for limiting a pivoting stroke of the movably swappable frame, and the limit assembly includes a limit pin installed at the carrying tray and a guide slot formed at the movably swappable frame and corresponsive to the limit pin, and the limit pin is passed into the guide slot.

Preferably, the movably swappable frame includes a data storage unit installed therein, and the fixed swap frame includes a data storage unit installed therein.

The server cabinet drawer structure of the present invention has the movably swappable frame that can be lifted to install the data storage units, so that it is convenient for users to swap a data storage unit inside the movably swappable frame.

DESCRIPTION OF THE PREFERRED EMBODIMENTS

The technical contents of the present invention will become apparent with the detailed description of preferred embodiments accompanied with the illustration of related drawings as follows. It is intended that the embodiments and figures disclosed herein are to be considered illustrative rather than restrictive.

Figure 1:
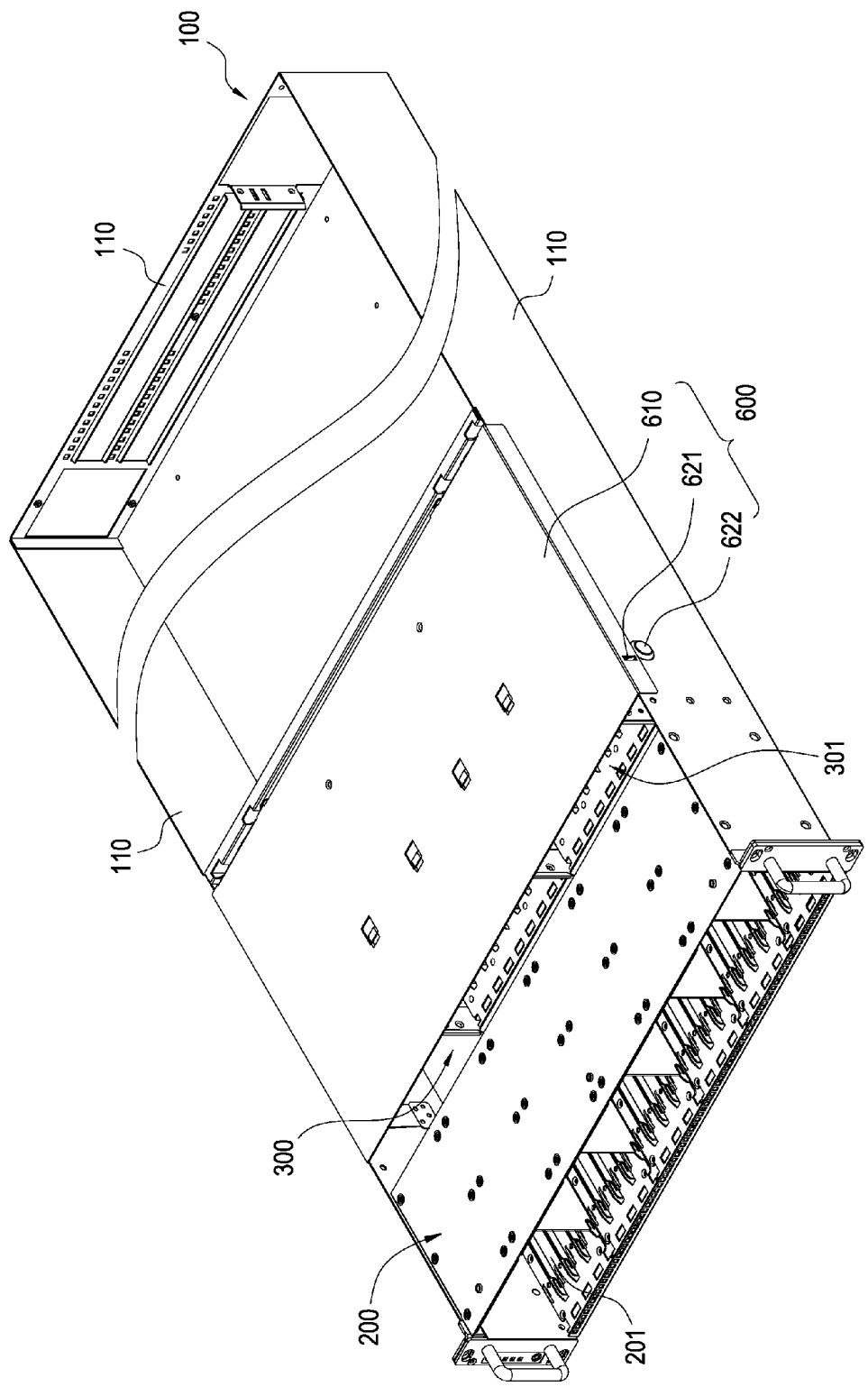
FIG. 1 is a perspective view of a server cabinet drawer structure in accordance with a preferred embodiment of the present invention.
Figure 2:
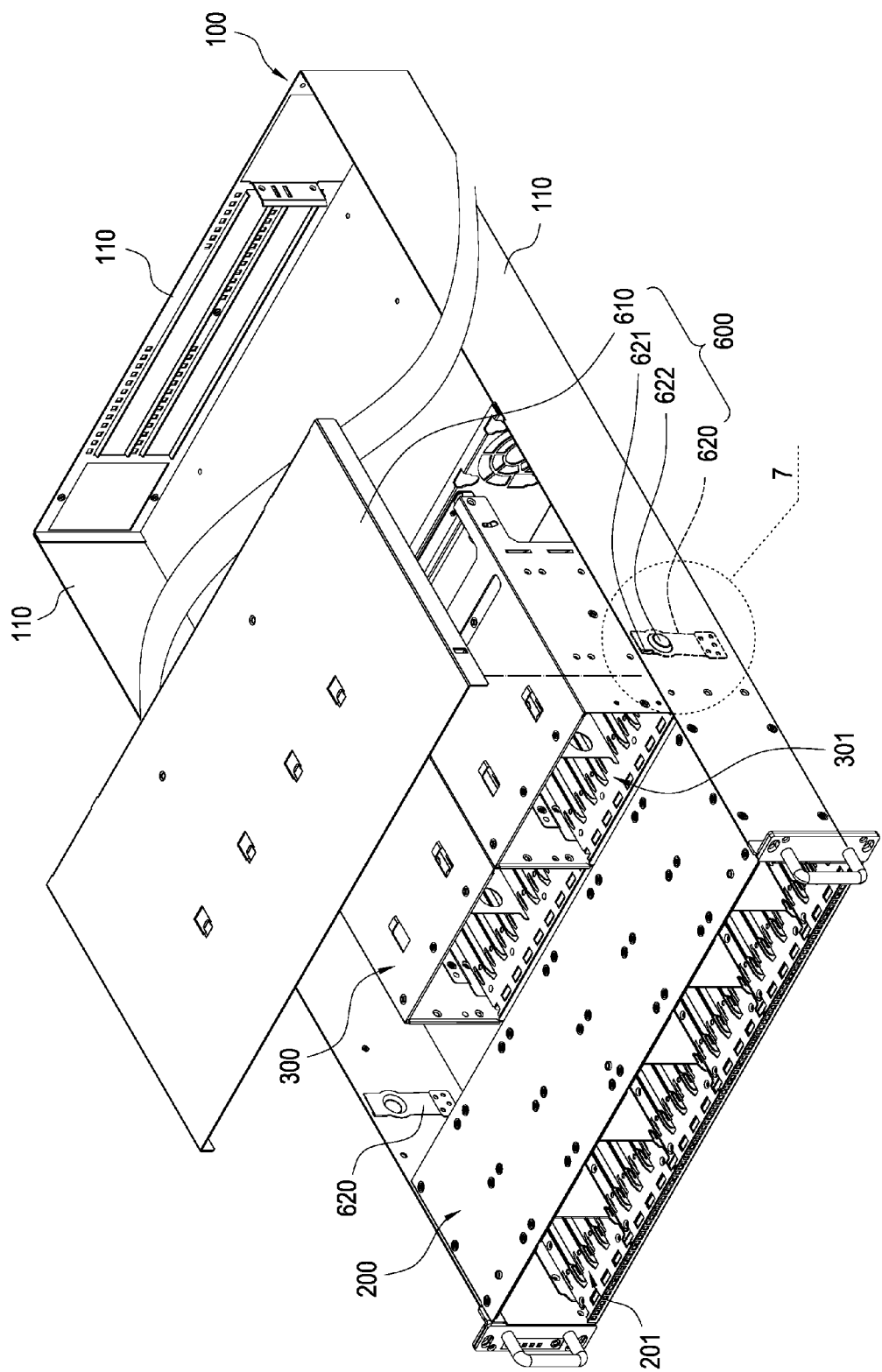
FIG. 2 is an exploded view of a server cabinet drawer structure in accordance with a preferred embodiment of the present invention.
Figure 3:
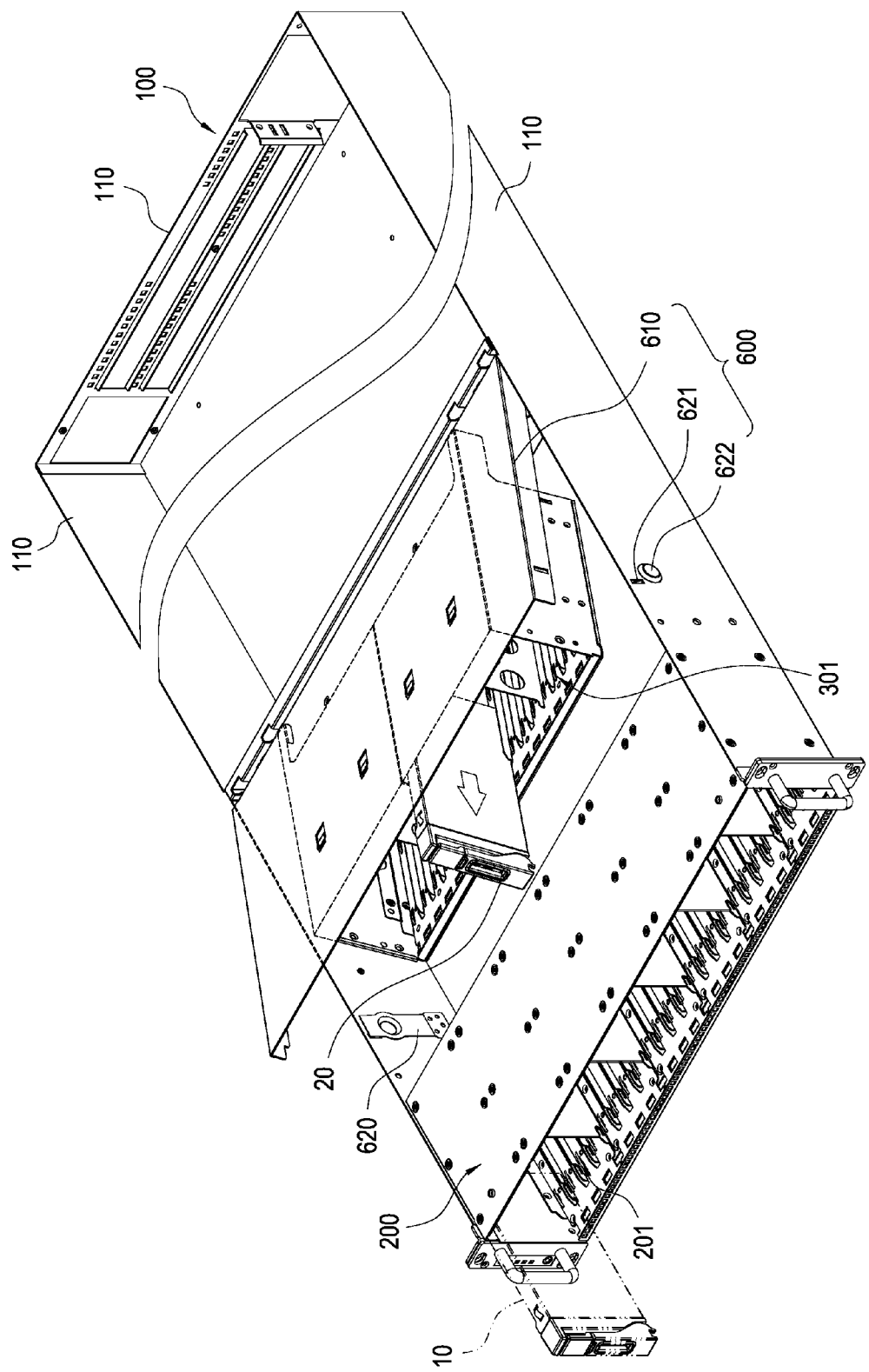
FIG. 3 is another perspective view of a server cabinet drawer structure in accordance with a preferred embodiment of the present invention.

With reference to FIGS. 1 to 3 for a server cabinet drawer structure of a preferred embodiment of the present invention, the server cabinet drawer structure is installed horizontally into a server cabinet drawer and capable of being pulled out from the server cabinet drawer. The server cabinet drawer structure comprises a carrying tray 100, a fixed swap frame 200, a movably swappable frame 300, a lifting element 400, a limit assembly 500 and a positioning assembly 600.

In this embodiment, the carrying tray 100 is preferably in a rectangular flat shape, and three sides of the carrying tray 100 are sidewalls 110 connected to one another continuously, and the remaining side of the carrying tray 100 is an open side. Wherein, two opposite sidewalls 110 have two through holes 111/112 respectively.

The fixed swap frame 200 is carried by the carrying tray and arranged on an open side adjacent to the carrying tray 100. The fixed swap frame 200 has a swap opening 201 exposed from the side of the carrying tray 100. The fixed swap frame 200 includes at least one data storage unit 10, and the data storage unit 10 inside the fixed swap frame 200 can be swapped through the swap opening 201 of the fixed swap frame 200.

Figure 4:
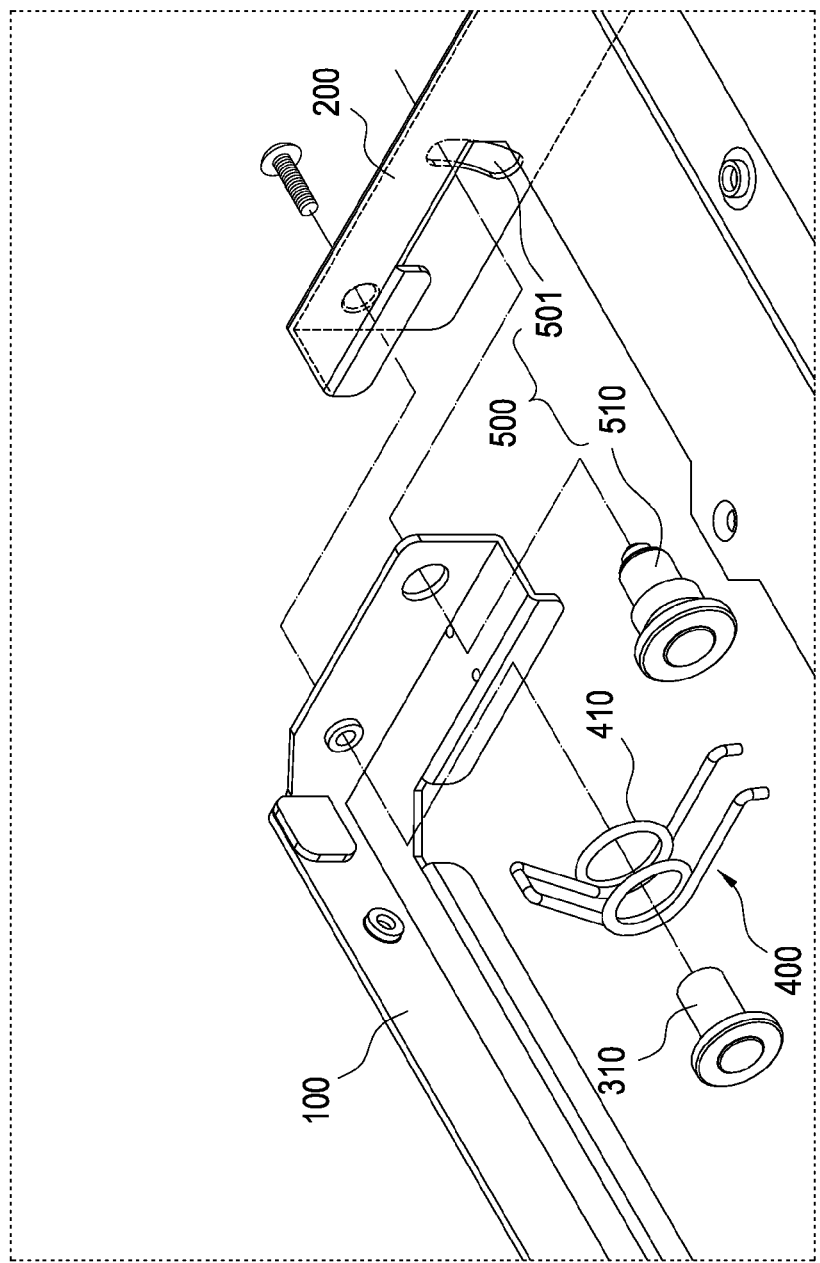
FIG. 4 is a partial exploded view of a server cabinet drawer structure in accordance with a preferred embodiment of the present invention.

In FIGS. 2 to 4, the movably swappable frame 300 is carried by the carrying tray 100, and a side of the movably swappable frame 300 is pivotally coupled to the carrying tray 100 through at least one pivot 310. In this preferred embodiment, a pivot 310 is disposed on two ends of a side of the movably swappable frame 300 separately and provided for pivoting the carrying tray 100. The movably swappable frame 300 is installed and arranged parallel to the fixed swap frame 200, and the fixed swap frame 200 is disposed between an open side of the carrying tray 100 and the movably swappable frame 300. The movably swappable frame 300 has a swap opening 301 arranged opposite to the pivot 310, and the swap opening 301 is aligned in a direction facing towards the fixed swap frame 200 and disposed adjacent to the fixed swap frame 200. The movably swappable frame 300 includes at least one data storage unit 20, and the data storage unit 20 inside the movably swappable frame 300 may be swapped through the swap opening 301 of the movably swappable frame 300.

In FIG. 4, the lifting element 400 is provided for lifting the movably swappable frame 300 away from the carrying tray 100. In this embodiment, the lifting element 400 preferably includes a pair of springs 410, and each spring 410 is connected to each respective pivot 310, and both ends of each spring 410 abut the carrying tray 100 and the movably swappable frame 300 respectively. When the movably swappable frame 300 is retracted to the carrying tray 100, the spring 410 is compressed, so that the elasticity of the spring 410 will lift the movably swappable frame 300 away from the carrying tray 100.

Figure 5:
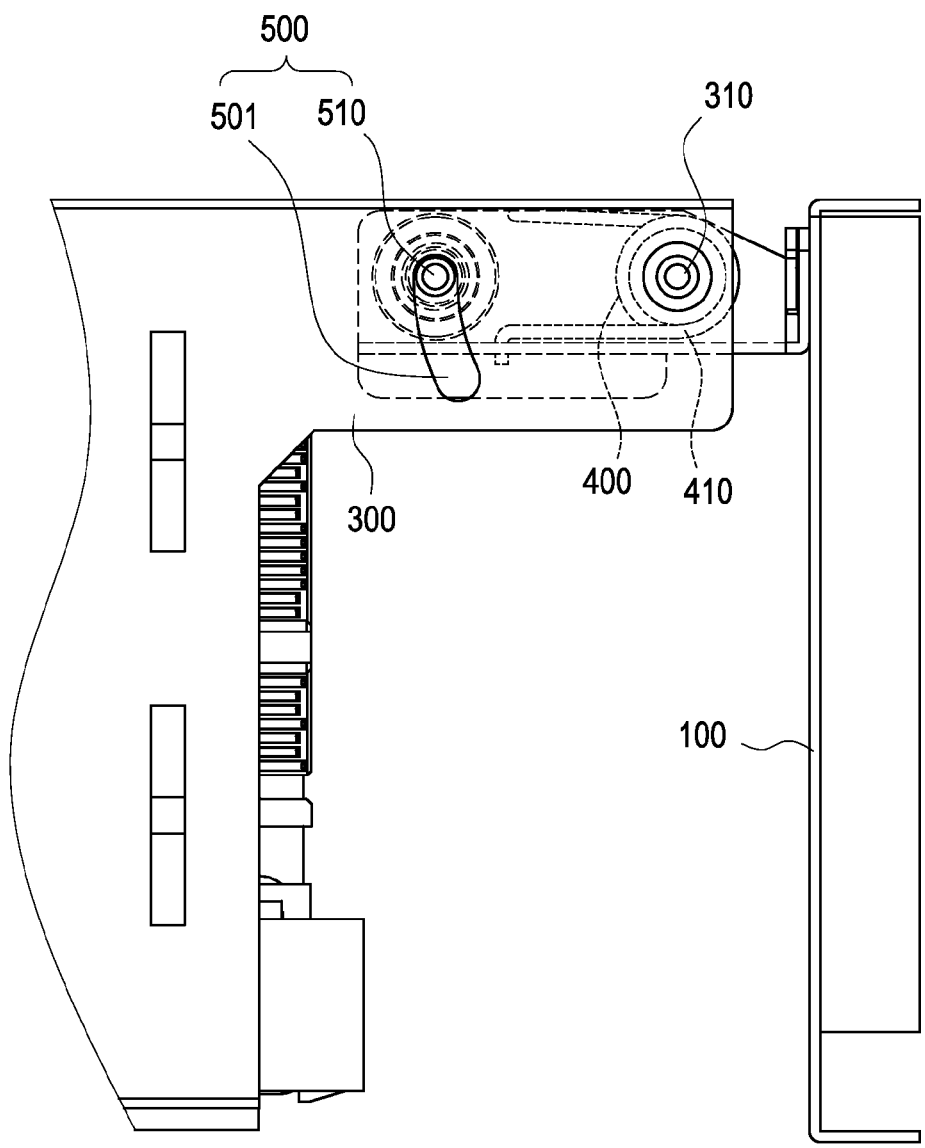
FIG. 5 is a schematic view of a limit assembly in a server cabinet drawer structure in accordance with a preferred embodiment of the present invention.
Figure 6:
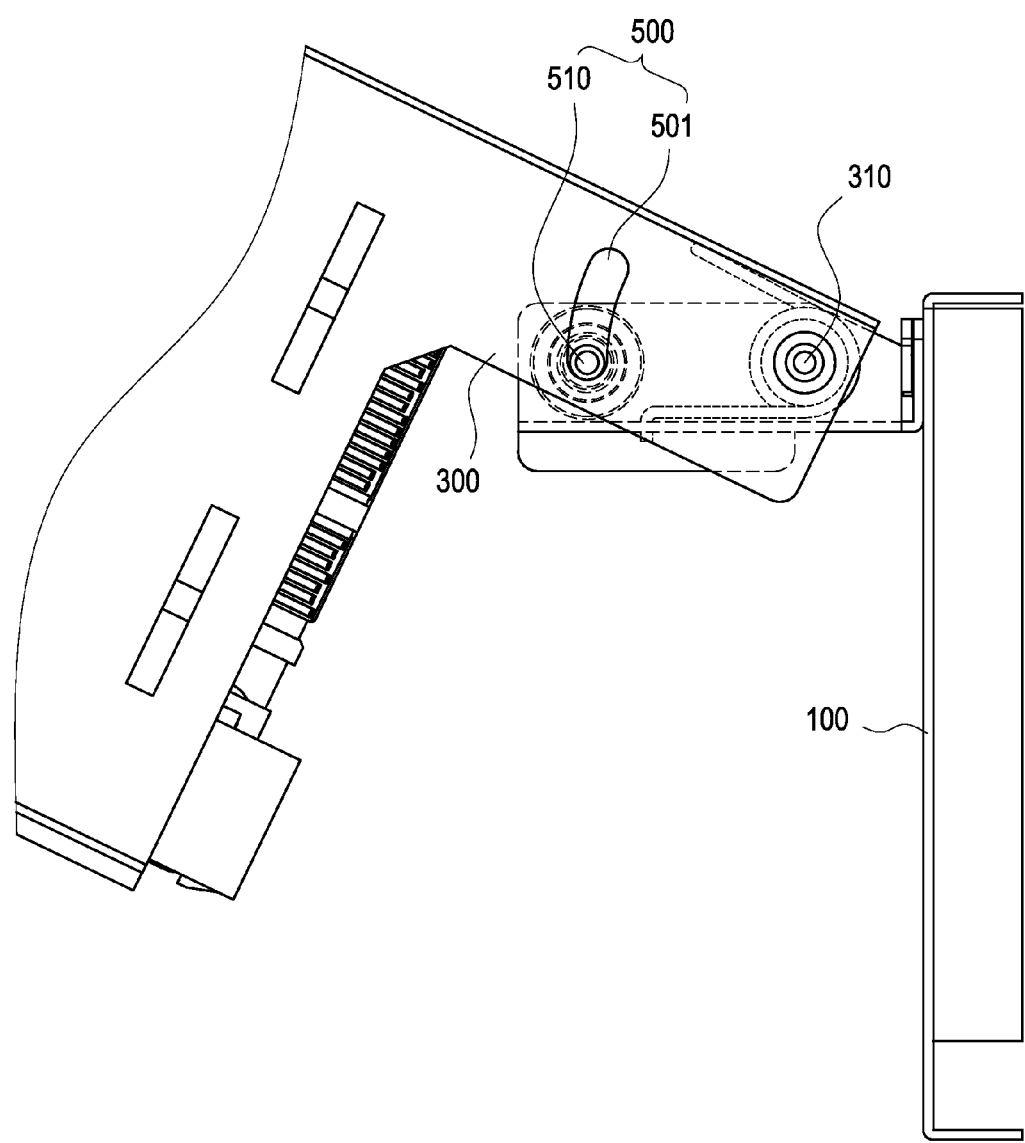
FIG. 6 is another schematic view of a limit assembly in a server cabinet drawer structure in accordance with a preferred embodiment of the present invention.

In FIGS. 5 and 6, the limit assembly 500 is coupled between the carrying tray 100 and the movably swappable frame 300 and provided for limiting the pivoting stroke of the movably swappable frame 300. In this embodiment, the limit assembly 500 includes a pair of limit pins 510 installed in the carrying tray 100 and a pair of guide slots 501 formed on the movably swappable frame 300 and corresponsive to the pair of limit pins respectively, and the limit pin 510 is passed through the guide slot 501 and movable along the guide slot 501, so that the upper limit and lower limit of the pivoting stroke of the movably swappable frame 300 are limited. This embodiment does not restrict the form of the limit assembly 500, and the limit pins 510 of the limit assembly 500 may be installed to the movably swappable frame 300, and the guide slots 501 may be formed on the carrying tray 100 and corresponsive to the limit pins 510 respectively.

Figure 7:
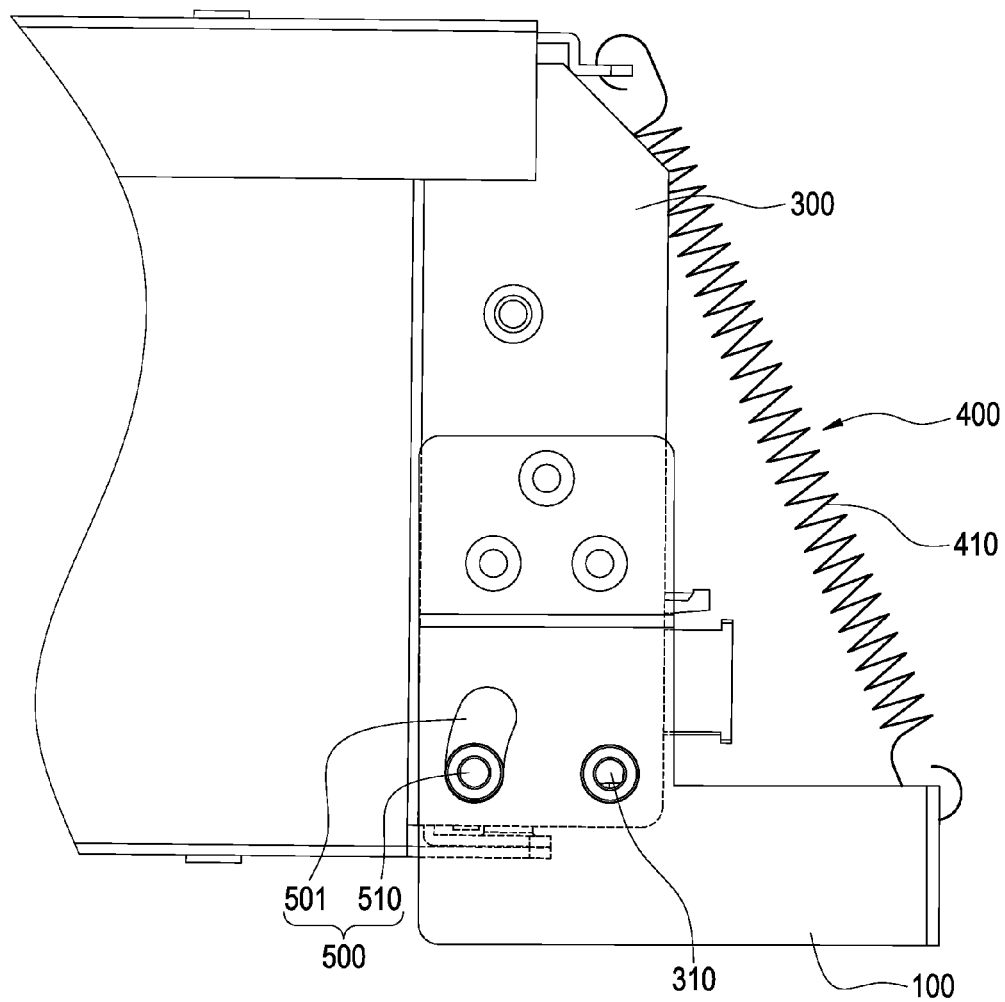
FIG. 7 is a schematic view of another form of a lifting element in a server cabinet drawer structure in accordance with a preferred embodiment of the present invention.
Figure 8:
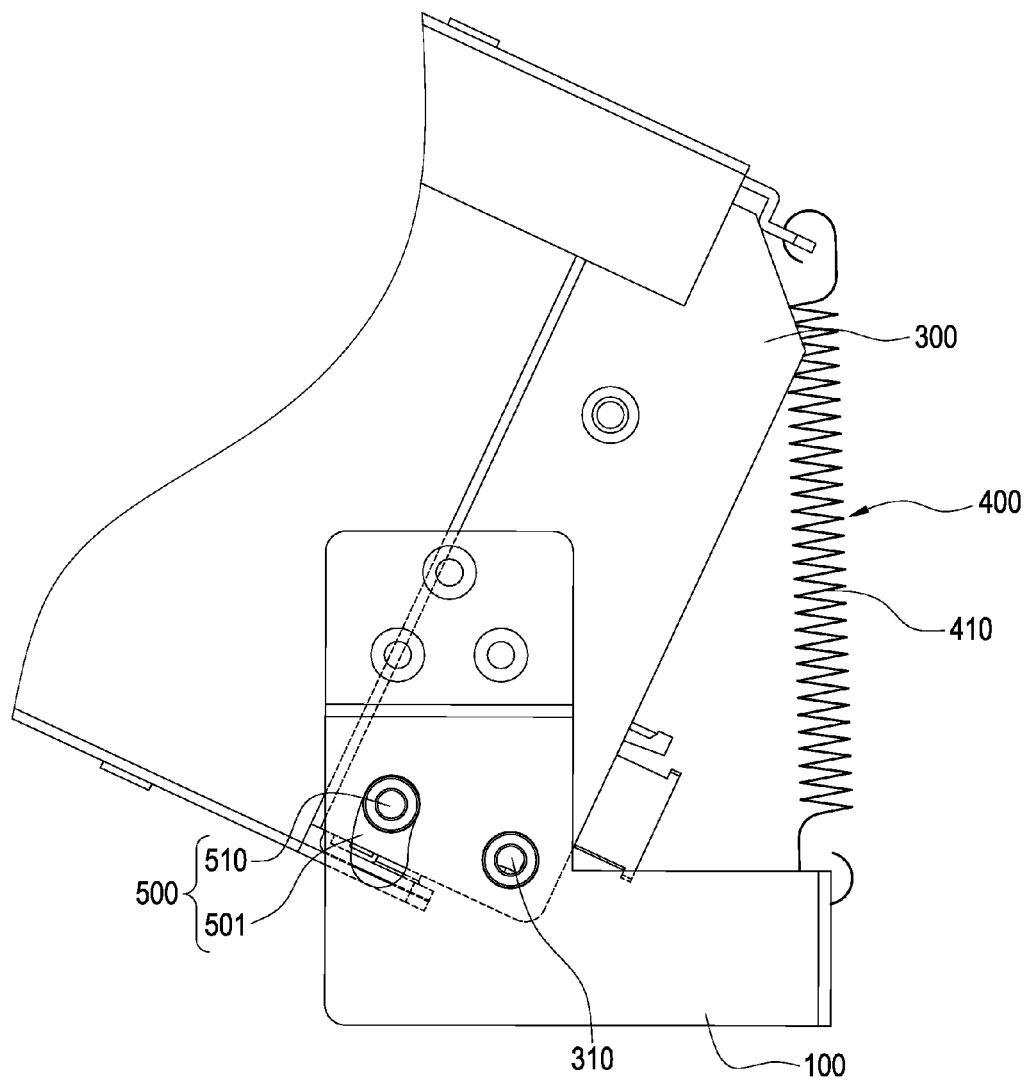
FIG. 8 is another schematic view of another form of a lifting element in a server cabinet drawer structure in accordance with a preferred embodiment of the present invention.

In FIGS. 7 and 8, the form of the spring 410 of the lifting element 400 is not limited in the present invention, and both ends of the spring 410 may be coupled to the carrying tray 100 and the movably swappable frame 300, such that the carrying tray 100 and the movably swapping frame 300 may be pulled by the spring 410. When the movably swappable frame 300 is retracted to the carrying tray 100, the spring 410 is stretched, so that the contraction of the spring 410 pulls the movably swappable frame 300 away from the carrying tray 100.

Figure 9:
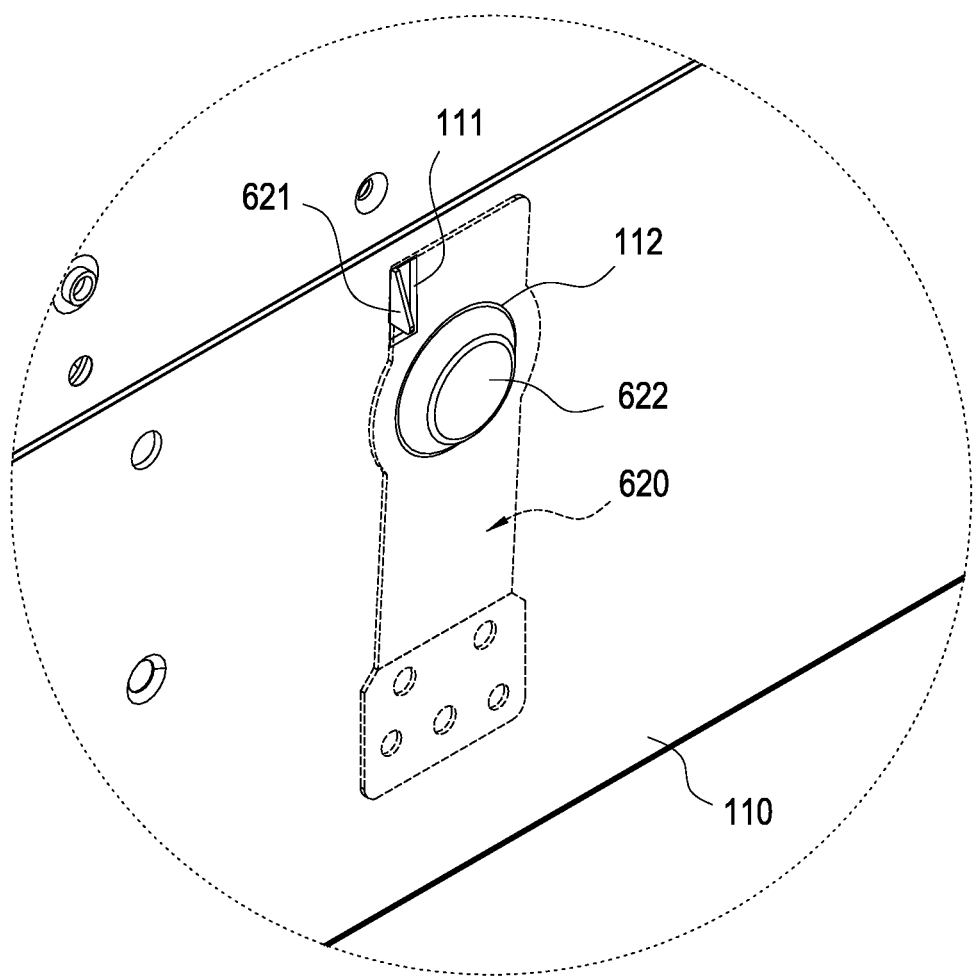
FIG. 9 is a schematic view of a positioning assembly in a server cabinet drawer structure in accordance with a preferred embodiment of the present invention.

In FIGS. 2, 3 and 9, when the movably swappable frame 300 is retracted to the carrying tray 100, the positioning assembly 600 is provided for balancing a force applied by the lifting element 400 to the movably swappable frame 300 to fix the movably swappable frame 300. The positioning assembly 600 includes a cover plate 610 pivotally coupled to the carrying tray 100 and covering the movably swappable frame 300 and a pair of elastic hook arms 620 fixed to the carrying tray 100 and disposed on an inner side of one of the pair of sidewalls 110 of the carrying tray 100, and each elastic hook arm 620 has a hook portion 621 formed on a corresponsive sidewall 110 and corresponsive to each respective through hole 111/112, and a protruding button 622 protruded from the elastic hook arm 620.

Figure 10:
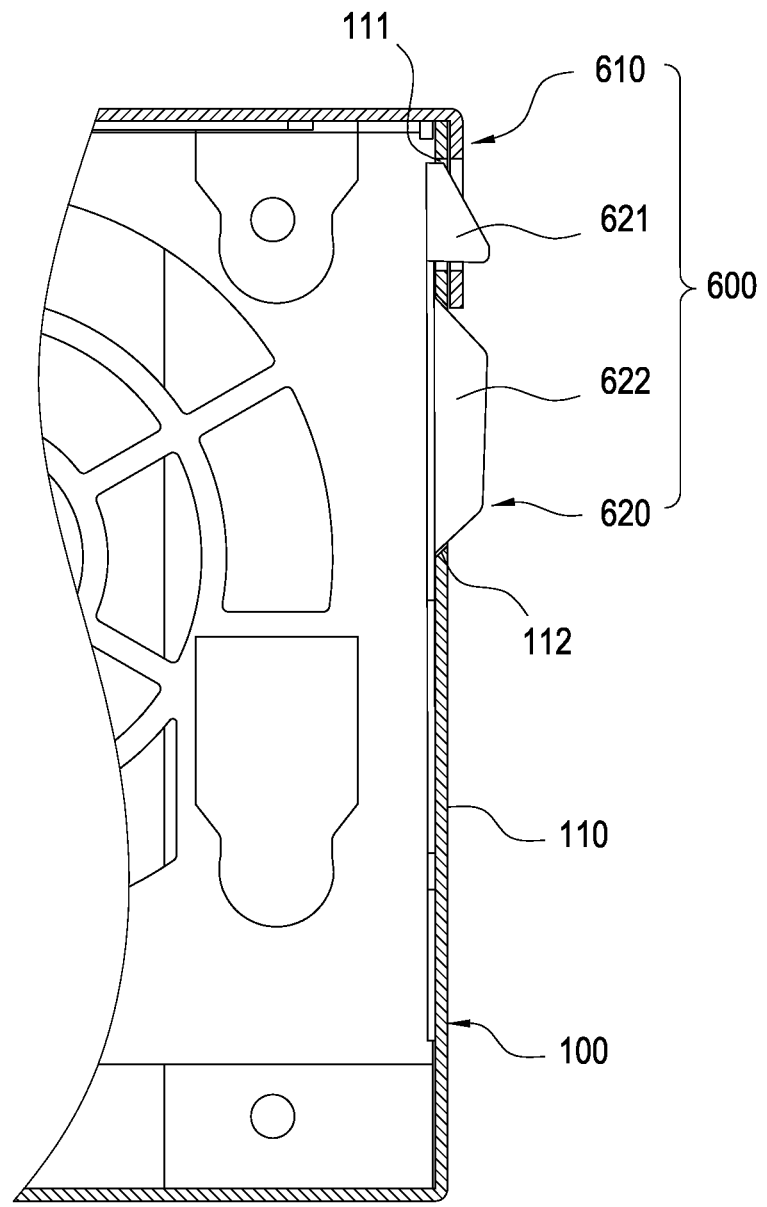
FIG. 10 is a cross-sectional view of a positioning assembly in a server cabinet drawer structure in accordance with a preferred embodiment of the present invention.

In FIG. 10, when the movably swappable frame 300 is retracted to the carrying tray 100, the cover plate 610 covers the movably swappable frame 300, and a pair of side edges of the cover plate 610 cover a portion of the outer side of the aforementioned pair of sidewalls 110, and the hook portion 621 of each elastic hook arm 620 is passed through the respective through hole 111 and out from the sidewall 110 to hook with two side edges of the cover plate 610, so as to fix the cover plate 610, and the cover plate 610 presses and positions the movably swappable frame 300 at the carrying tray 100.

Figure 11:
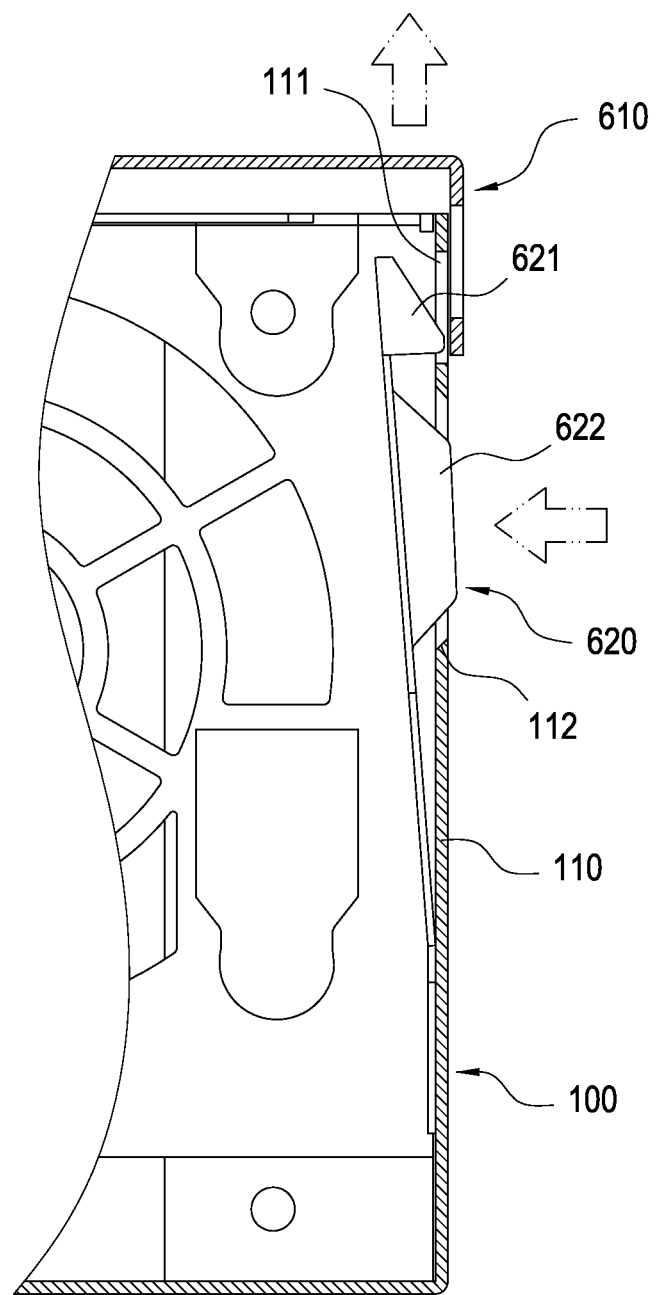
FIG. 11 is another cross-sectional view of a positioning assembly in a server cabinet drawer structure in accordance with a preferred embodiment of the present invention.

In FIG. 11, the protruding button 622 is passed through the respective through hole 112 of the sidewall 110 and exposed from an outer side of the sidewall 110, so that a user may press and push the elastic hook arm 620, and the protruding button 622 is pressed to move the hook portion 621 to release the cover plate 610. When the cover plate 610 is released, the movably swappable frame 300 is lifted by the lifting element 400, and then pivoted and popped out.

Figure 12:
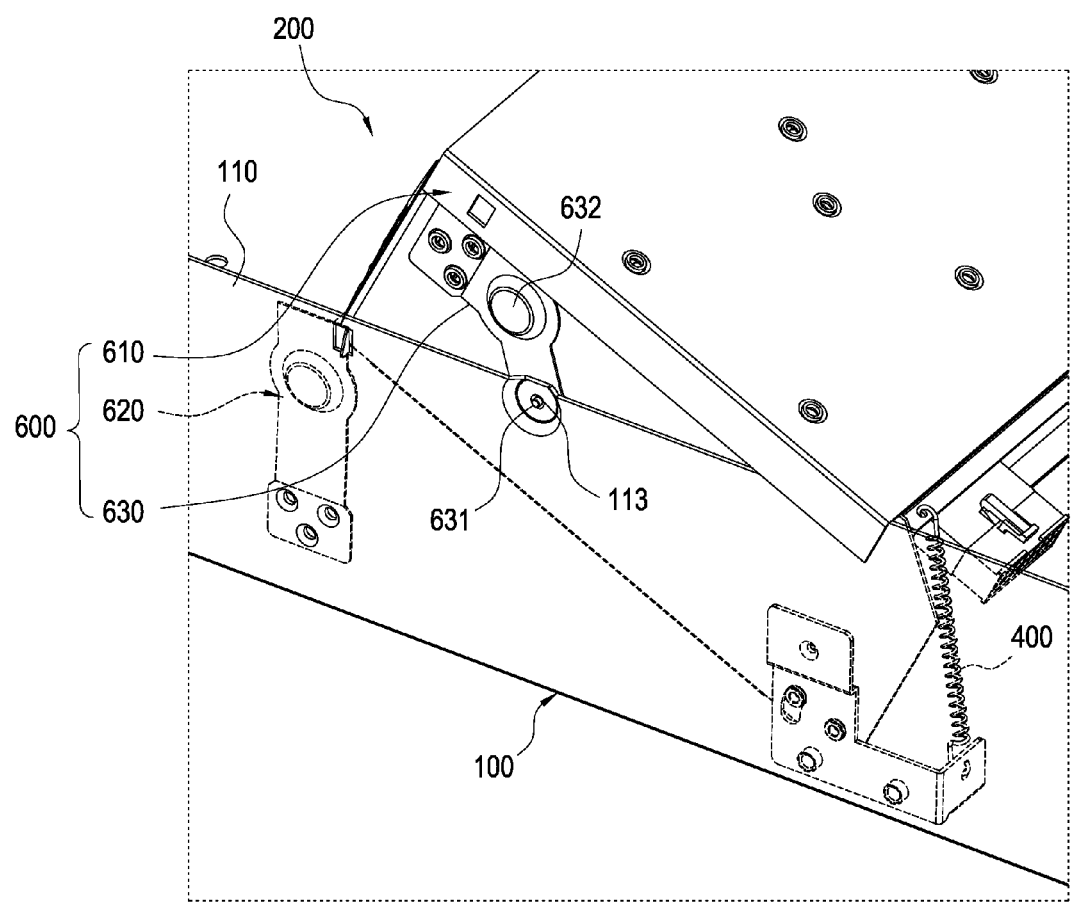
FIG. 12 is another cross-sectional view of a positioning assembly in a server cabinet drawer structure in accordance with a preferred embodiment of the present invention.
Figure 13:
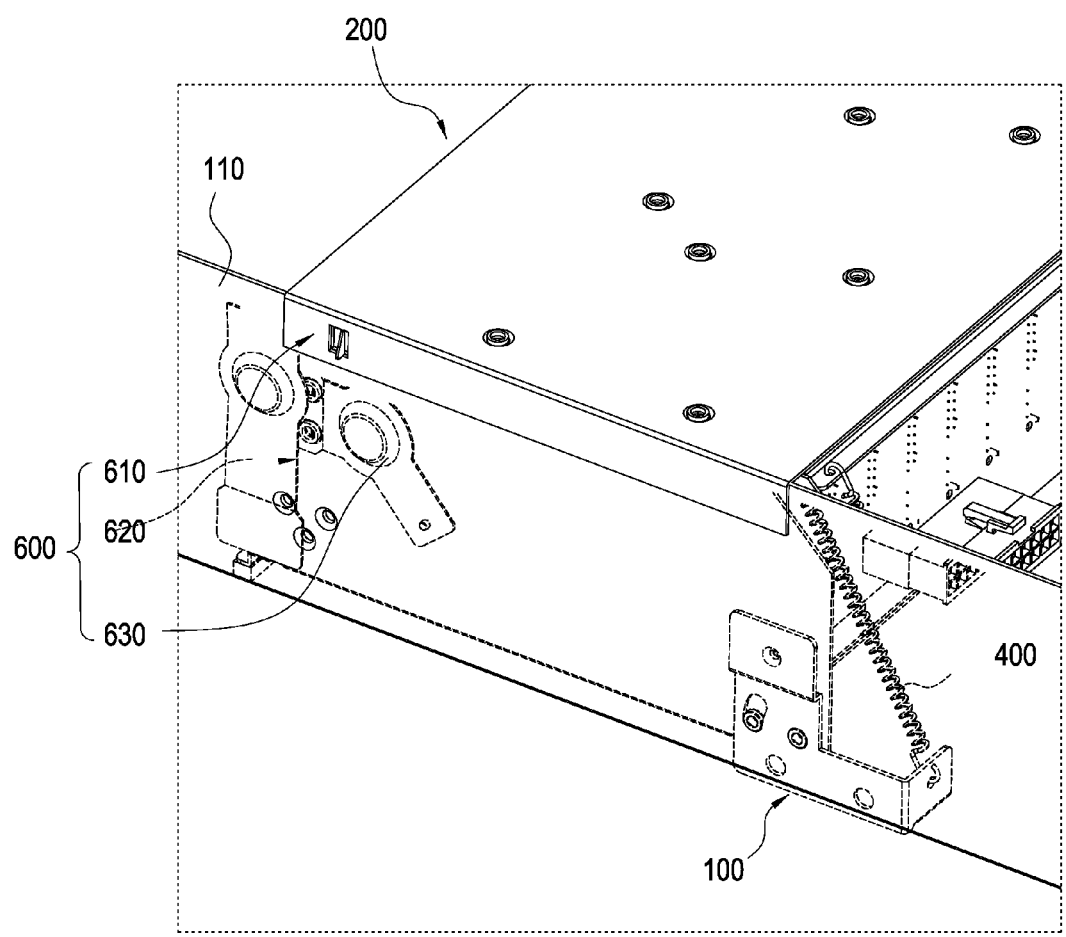
FIG. 13 is another cross-sectional view of a positioning assembly in a server cabinet drawer structure in accordance with a preferred embodiment of the present invention.

The positioning assembly 600 as shown in FIGS. 12 and 13 further includes another elastic hook arm 630 fixed to the movably swappable frame 300, and a positioning hole 113 formed at a position of the sidewall 110 of the carrying tray 100 and corresponsive to the sidewall 110 of the carrying tray 100, and the elastic hook arm 630 has a hook portion 631 corresponsive to the positioning hole 113 and a protruding button 632 protruded from the elastic hook arm 630. When the movably swappable frame 300 is lifted away from the carrying tray 100, the hook portion 631 of the elastic hook arm 630 hooks the corresponsive positioning hole 113 to position the movably swappable frame 300. The protruding button 632 is pressed to move and retract the hook portion 631 from the positioning hole 113 to release the movably swappable frame 300, so that the movably swappable frame 300 is pressed and pushed back to the carrying tray 100.

In the server cabinet drawer structure of the present invention, the carrying tray 100 includes the fixed swap frame 200 and the movably swappable frame 300 that can be lifted, and both of them are provided for installing and accommodating the data storage units 10/20. When the movably swappable frame 300 is lifted by the lifting element 400, the swap opening 301 is heightened and will not be blocked by the fixed swap frame 200. The present invention not just allows users to arrange storage units 10/20 densely on the carrying tray only, but also lifts the movably swappable frame 300 up to facilitate users to swap the data storage unit 20.

While the invention has been described by means of specific embodiments, numerous modifications and variations could be made thereto by those skilled in the art without departing from the scope and spirit of the invention set forth in the claims.

What is claimed is:

1. A server cabinet drawer structure, comprising:
    a carrying tray;
    a movably swappable frame, carried by the carrying tray, and having a side pivotally coupled to the carrying tray by a pivot; and
    a lifting element, coupled to the carrying tray and the movably swappable frame, and provided for lifting the movably swappable frame away from the carrying tray,
    wherein the carrying tray includes a positioning assembly, and the lifting element includes a spring coupled between the carrying tray and the movably swappable frame, such that when the movably swappable frame is retracted to the carrying tray, the positioning assembly is provided for balancing a force of the spring applied to the movably swappable frame to fix the movably swappable frame;
    wherein the positioning assembly includes a cover plate pivotally coupled to the carrying tray and covering the movably swappable frame, and an elastic hook arm installed to the carrying tray, such that when the movably swappable frame is retracted to the carrying tray, the cover plate covers the movably swapping frame, and the elastic hook arm hooks the cover plate to fix the cover plate and press the movably swappable frame against the carrying tray.

2. The server cabinet drawer structure of claim 1, wherein the carrying tray has at least one sidewall, and the elastic hook arm is installed to the sidewall.

3. The server cabinet drawer structure of claim 2, wherein when the cover plate covers the movably swappable frame, a side edge of the cover plate covers a portion of an outer side of the sidewall, and the elastic hook arm is installed to an inner side of the sidewall, and the sidewall has a through hole corresponsive to the elastic hook arm for passing the elastic hook arm out to hook the side edge of the cover plate.

4. The server cabinet drawer structure of claim 3, wherein the elastic hook arm includes a protruding button, and the sidewall has a through hole corresponsive to the protruding button, and the protruding button is passed through the through hole and exposed from an outer side of the sidewall.

5. The server cabinet drawer structure of claim 1, wherein when the movably swappable frame is lifted away from the carrying tray, the positioning assembly is provided for fixing the movably swappable frame.

6. A server cabinet drawer structure, comprising:
    a carrying tray;
    a movably swappable frame, carried by the carrying tray, and having a side pivotally coupled to the carrying tray by a pivot; and
    a lifting element, coupled to the carrying tray and the movably swappable frame, and provided for lifting the movably swappable frame away from the carrying tray,
    wherein the carrying tray includes a positioning assembly, and the lifting element includes a spring coupled between the carrying tray and the movably swappable frame, such that when the movably swappable frame is retracted to the carrying tray, the positioning assembly is provided for balancing a force of the spring applied to the movably swappable frame to fix the movably swappable frame;
    wherein when the movably swappable frame is lifted away from the carrying tray, the positioning assembly is provided for fixing the movably swappable frame;
    wherein the positioning assembly includes an elastic hook arm fixed to the movably swappable frame, such that when the movably swappable frame is lifted away from the carrying tray, the elastic hook arm hooks the carrying tray to fix the movably swappable frame.

7. The server cabinet drawer structure of claim 6, wherein the carrying tray includes at least one sidewall, and the sidewall has a positioning hole corresponsive to the elastic hook arm.

8. The server cabinet drawer structure of claim 7, wherein the elastic hook arm has a hook portion formed thereon and configured to be corresponsive to the positioning hole.

9. The server cabinet drawer structure of claim 7, wherein the elastic hook arm has a protruding button protruded from the elastic hook arm.

10. The server cabinet drawer structure of claim 1, wherein the carrying tray includes a fixed swap frame fixed thereon and disposed adjacent to a side of the carrying tray, and the fixed swap frame is disposed between the side and the movably swappable frame.

11. The server cabinet drawer structure of claim 10, wherein the movably swappable frame has a swap opening configured to be corresponsive to the pivot, and the swap opening and the fixed swap frame are configured adjacent to each other.

12. The server cabinet drawer structure of claim 1, further comprising a limit assembly coupled between the carrying tray and the movably swappable frame for limiting a pivoting stroke of the movably swappable frame, and the limit assembly including a limit pin installed at the carrying tray and a guide slot formed at the movably swappable frame and corresponsive to the limit pin, and the limit pin being passed into the guide slot.

13. The server cabinet drawer structure of claim 10, wherein the movably swappable frame includes a data storage unit installed therein, and the fixed swap frame includes a data storage unit installed therein.

14. The server cabinet drawer structure of claim 6, wherein the carrying tray includes a fixed swap frame fixed thereon and disposed adjacent to a side of the carrying tray, and the fixed swap frame is disposed between the side and the movably swappable frame.

15. The server cabinet drawer structure of claim 14, wherein the movably swappable frame has a swap opening configured to be corresponsive to the pivot, and the swap opening and the fixed swap frame are configured adjacent to each other.

16. The server cabinet drawer structure of claim 6, further comprising a limit assembly coupled between the carrying tray and the movably swappable frame for limiting a pivoting stroke of the movably swappable frame, and the limit assembly including a limit pin installed at the carrying tray and a guide slot formed at the movably swappable frame and corresponsive to the limit pin, and the limit pin being passed into the guide slot.

17. The server cabinet drawer structure of claim 14, wherein the movably swappable frame includes a data storage unit installed therein, and the fixed swap frame includes a data storage unit installed therein.

* * * * *